(12) United States Patent
Tsai et al.

(10) Patent No.: US 9,806,116 B2
(45) Date of Patent: Oct. 31, 2017

(54) COMPLEMENTARY METAL GRID AND DEEP TRENCH ISOLATION IN CIS APPLICATION

(71) Applicant: TAIWAN SEMICONDUCTOR MANUFACTURING CO., LTD., Hsinchu (TW)

(72) Inventors: Bo-Tsung Tsai, Kaohsiung (TW); Chun-Hao Chou, Tainan (TW); Tsung-Han Tsai, Miaoli County (TW); Kuo-Cheng Lee, Tainan (TW); Yung-Lung Hsu, Tainan (TW); Yun-Wei Cheng, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/925,576

(22) Filed: Oct. 28, 2015

(65) Prior Publication Data

US 2017/0125459 A1    May 4, 2017

(51) Int. Cl.
*H01L 27/146* (2006.01)

(52) U.S. Cl.
CPC ...... *H01L 27/1463* (2013.01); *H01L 27/1462* (2013.01); *H01L 27/14621* (2013.01); *H01L 27/14629* (2013.01); *H01L 27/14645* (2013.01); *H01L 27/14685* (2013.01); *H01L 27/14689* (2013.01)

(58) Field of Classification Search
CPC .................................................. H01L 27/1463
See application file for complete search history.

(56) References Cited

U.S. PATENT DOCUMENTS

2015/0263054 A1*  9/2015  Chien et al. ...... H01L 27/14623
                                                257/292

* cited by examiner

*Primary Examiner* — Fernando L Toledo
*Assistant Examiner* — Valerie N Newton
(74) *Attorney, Agent, or Firm* — Maschoff Brennan

(57) ABSTRACT

A CMOS image sensor structure includes a substrate and pixel portions. Each pixel portion includes intersection areas, the border areas each of which is located between any two adjacent ones of the intersection areas, and a central area surrounded by the intersection areas and the border areas. Each pixel portion includes a device layer, an anti-reflective coating layer, discrete reflective structures, discrete metal blocking structures, a passivation layer and a color filter. The device layer is disposed on the substrate. Trenches are formed in the device layer and the substrate corresponding to the border areas respectively. The anti-reflective coating layer conformally covers the device layer, the substrate and the trenches. The reflective structures are disposed in the trenches. The metal blocking structures overly the anti-reflective coating layer in the intersection areas. The passivation layer conformally covers the metal blocking structures. The color filter is disposed on the passivation layer.

20 Claims, 16 Drawing Sheets

COMPLEMENTARY METAL GRID AND DEEP TRENCH ISOLATION IN CIS APPLICATION

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

A front side illuminated (FSI) CMOS image sensor and a back side illuminated (BSI) CMOS image sensor are two types of CMOS image sensors. The FSI CMOS image sensor is operable to detect light projected from its front side while the BSI CMOS image sensor is operable to detect light projected from its backside. The BSI CMOS image sensor can shorten optical paths and increase fill factors to improve light sensitivity per unit area and quantum efficiency, and can reduce cross talk and photo response non-uniformity. Hence, the image quality of the CMOS image sensor can be significantly improved. Furthermore, the BSI CMOS image sensor has a high chief ray angle, which allows a shorter lens height to be implemented, so that a thinner camera module is achieved. Accordingly, the BSI CMOS image sensor technology is becoming a mainstream technology.

However, conventional BSI CMOS image sensors and methods of fabricating the BSI CMOS image sensors have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
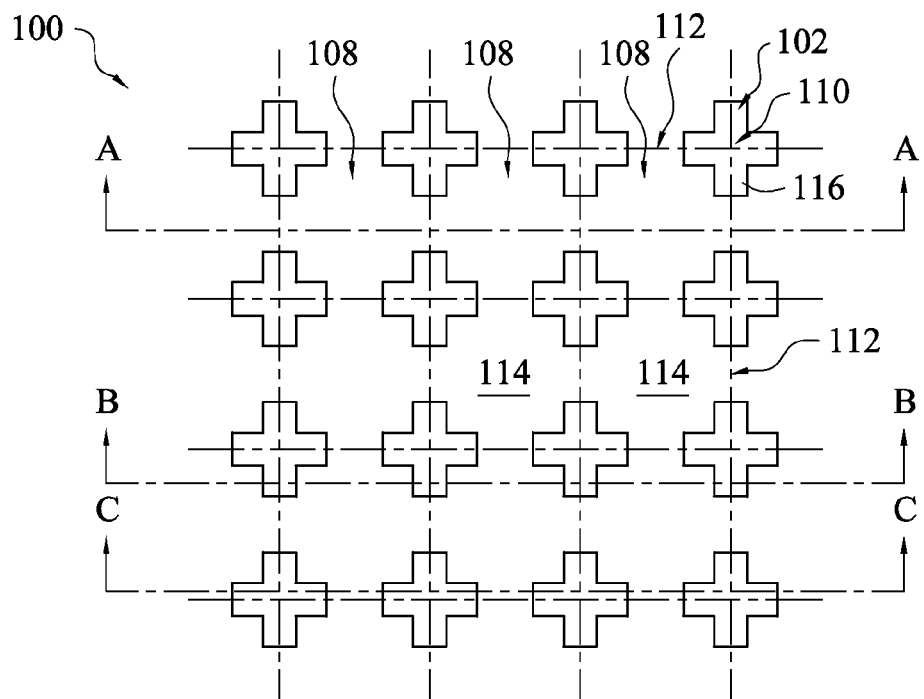
FIG. 1A is a schematic view of a layout of a metal grid structure of a CMOS image sensor structure in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical CMOS image sensor, a trench isolation layer, which is formed in a device layer and a substrate underlying the device layer, and a metal grid layer formed on the trench isolation layer are used to form a light guide structure to constrain an incident light, so as to prevent crosstalk. However, the metal grid layer inevitably blocks the incident light, such that quantum efficiency (QE) of the CMOS image sensor is lowered. In addition, the operation of forming the trench isolation layer includes using a dry etching process to form a trench in the device layer and the substrate, and depositing a reflective material to fill the trench. However, the dry etching process damages a bottom and a side surface of the trench, thus an imaging performance of the CMOS image sensor is degraded.

Embodiments of the present disclosure are directed to providing a CMOS image sensor structure and a method for manufacturing the CMOS image sensor structure, in which a layout of a metal grid structure overlying a device layer and a layout of reflective structures are complementary, such that a light guide mechanism of the metal grid structure and the reflective structures is kept for crosstalk improvement while the metal grid structure and the reflective structures release some areas for optical performance improvement. Furthermore, an occupied area of the metal grid structure is decreased, thus increasing quantum efficiency of the CMOS image sensor structure. Moreover, an occupied area of the reflective structures is decreased, such that damage of the device layer and the substrate caused during the formation of the reflective structures is reduced, thereby enhancing an imaging performance of the CMOS image sensor and enlarging a process window.

Figure 1B:
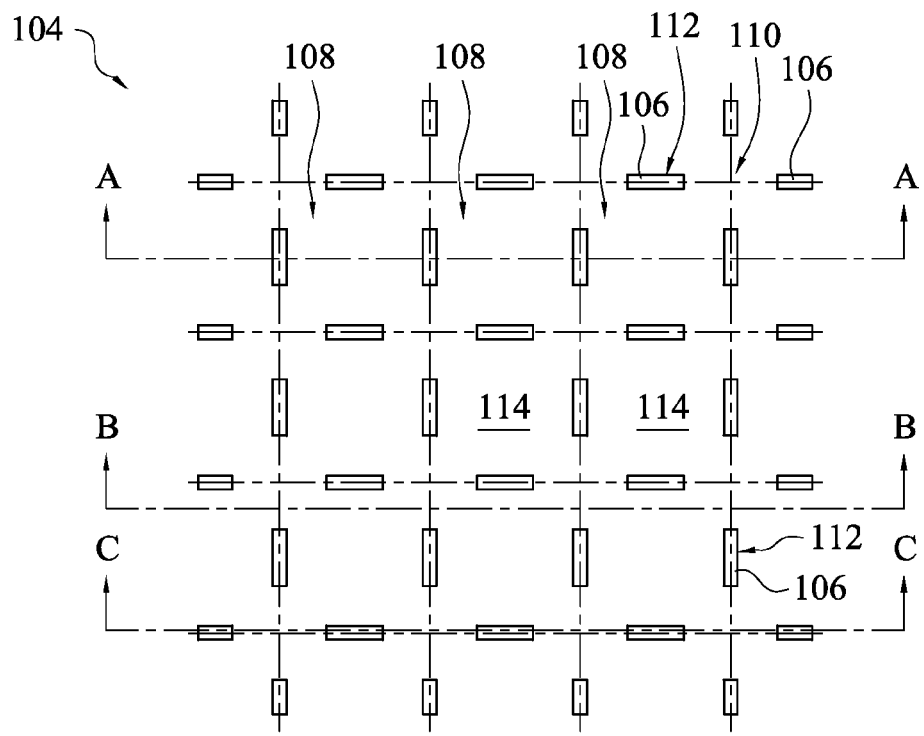
FIG. 1B is a schematic view of a layout of reflective structures of a CMOS image sensor structure in accordance with various embodiments.

Referring to FIG. 1A and FIG. 1B, FIG. 1A is a schematic view of a layout of a metal grid structure of a CMOS image sensor structure in accordance with various embodiments, and FIG. 1B is a schematic view of a layout of reflective structures of a CMOS image sensor structure in accordance with various embodiments. A layout 100 of a metal grid structure 102 and a layout 104 of reflective structures 106 in a CMOS image sensor structure 120 (referring to FIG. 1C) are mesh-like layouts, in which each of the layouts 100 and 104 is modified by removing some portions from a mesh layout. The metal grid structure 102 includes various metal blocking structures 116. As shown in FIG. 1A and FIG. 1B, the metal grid structure 102 and the reflective structures 106 collectively define various pixel portions 108. The pixel portions 108 are arranged in an array, and are adjacent to each other. The metal grid structure 102 and the reflective structures 106 are configured to prevent the light from diffusing to the adjacent pixel portions 108.

In some examples, each of the pixel portions 108 includes various intersection areas 110, various border areas 112 and a central area 114. As shown in FIG. 1A and FIG. 1B, the intersection areas 110 are respectively located at corners of the pixel portion 108. The border areas 112 are respectively located at borders of the pixel portion 108, and each of the border areas 112 is located between any two adjacent ones of the intersection areas 110. The central area 114 is located at a center of the pixel portion 108 and is surrounded by the intersection areas 110 and the border areas 112. The metal blocking structures 116 of the metal grid structure 102 and the reflective structures 106 are arranged in a complementary manner. In the embodiment, the metal blocking structures 116 are respectively disposed in the intersection areas 110, and the reflective structures 106 are respectively disposed in the border areas 112. In some examples, adjacent ones of the metal blocking structures 116 in the intersection areas 110 which are adjacent to each other are combined to form a shape of a crisscross.

Figure 1C:
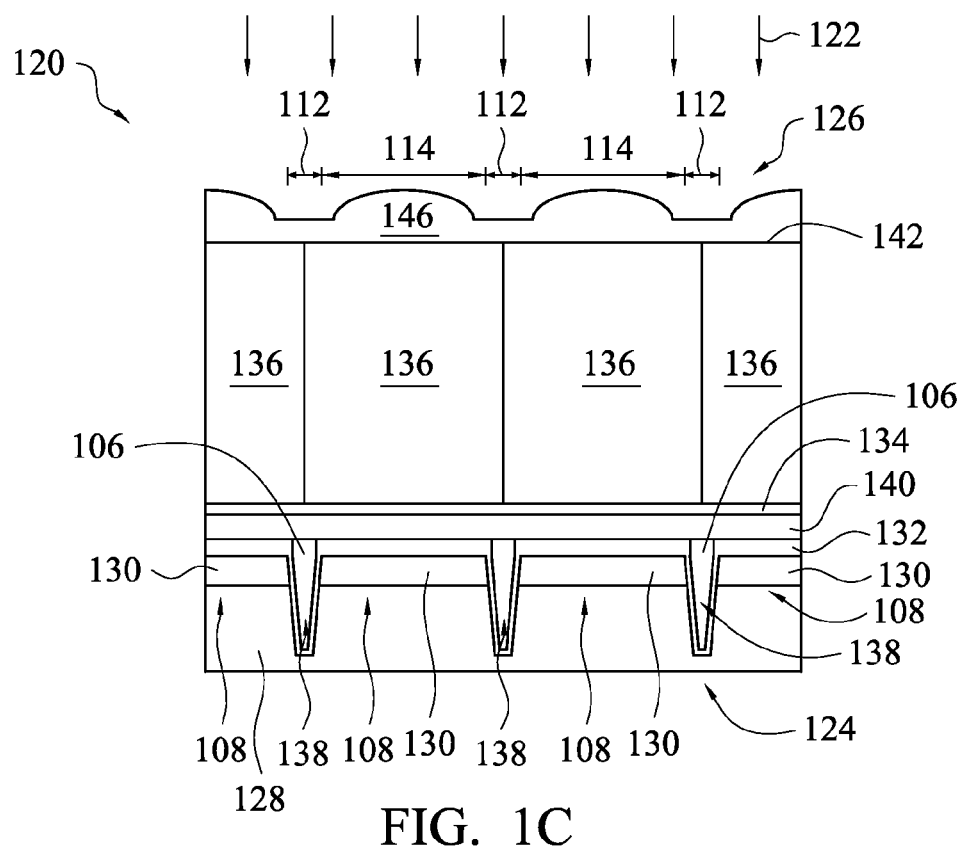
FIG. 1C is schematic cross-sectional view of the CMOS image sensor structure taken along line A-A of FIG. 1A and FIG. 1B.
Figure 1D:
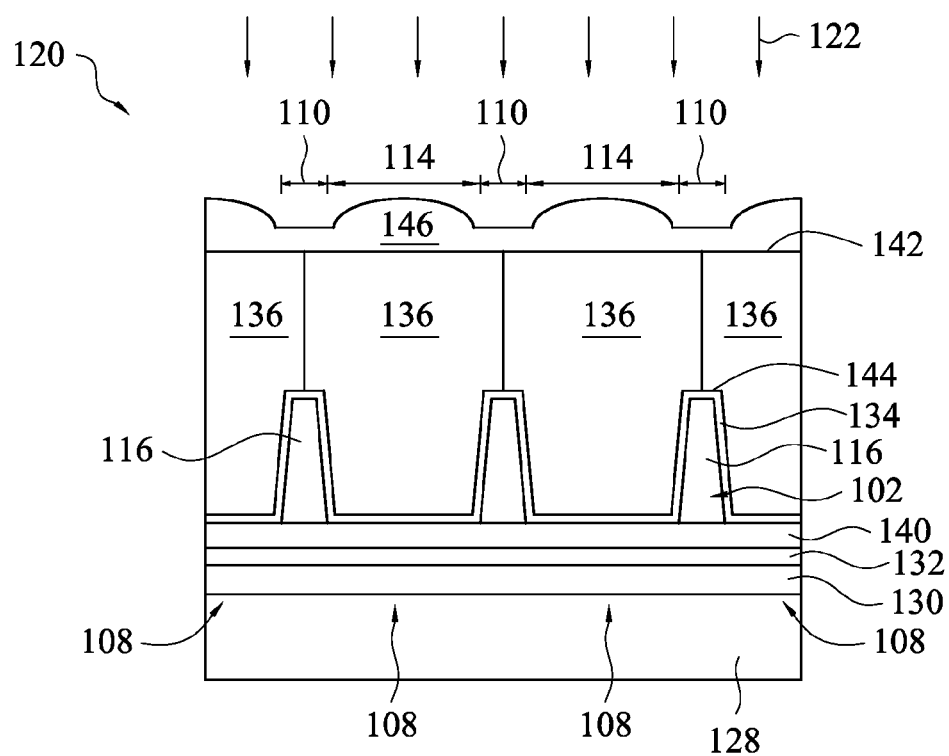
FIG. 1D is schematic cross-sectional view of the CMOS image sensor structure taken along line B-B of FIG. 1A and FIG. 1B.
Figure 1E:
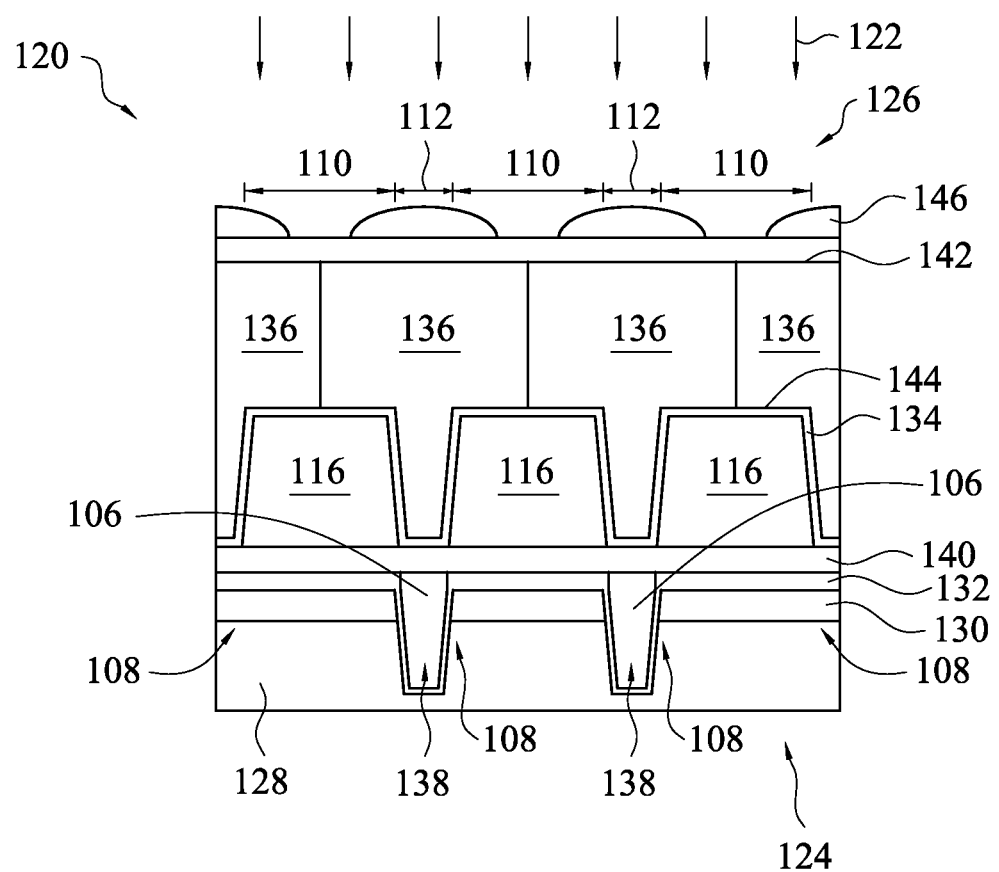
FIG. 1E is schematic cross-sectional view of the CMOS image sensor structure taken along line C-C of FIG. 1A and FIG. 1B.

Referring to FIG. 1C, FIG. 1D and FIG. 1E, FIG. 1C is schematic cross-sectional view of the CMOS image sensor structure taken along line A-A of FIG. 1A and FIG. 1B, FIG. 1D is schematic cross-sectional view of the CMOS image sensor structure taken along line B-B of FIG. 1A and FIG. 1B, and FIG. 1E is schematic cross-sectional view of the CMOS image sensor structure taken along line C-C of FIG. 1A and FIG. 1B. The CMOS image sensor structure 120 may be operated for sensing incident light 122. The CMOS image sensor structure 120 has a front side 124 and a back side 126. In some examples, the CMOS image sensor structure 120 is a BSI CMOS image sensor device, which is operated to sense the incident light 122 projected from its back side 126.

As shown in FIG. 1C, FIG. 1D and FIG. 1E, the CMOS image sensor structure 120 includes a substrate 128 and the pixel portions 108. The substrate 128 is a semiconductor substrate, and may be composed of a single-crystalline semiconductor material or a compound semiconductor material. For example, silicon, germanium or glass may be used as a material of the substrate 128.

The pixel portions 108 are arranged on the substrate 128 in an array and are adjacent to each other. In some examples, as shown in FIG. 1C, FIG. 1D and FIG. 1E, each of the pixel portions 108 includes a device layer 130, an anti-reflective coating layer 132, various discrete reflective structures 106, various discrete metal blocking structures 116, a passivation layer 134 and a color filter 136.

In each of the pixel portions 108, the device layer 130 is disposed in the intersection areas 110, the border areas 112 and the central area 114 on the substrate 128. In some examples, a material of the device layer 130 includes silicon. For example, the material of the device layer 130 may include epitaxial silicon. Referring to FIG. 1C and FIG. 1E again, various trenches 138 are formed in the device layer 130 and the substrate 128 corresponding to the border areas 112 respectively. Each of the trenches 138 extends from a top of the device layer 130 to the substrate 128. In some examples, each of the trenches 138 is a deep trench.

As shown in FIG. 1C, FIG. 1D and FIG. 1E, the anti-reflective coating layer 132 conformally covers the device layer 130, the substrate 128 and the trenches 138. The anti-reflective coating layer 132 is configured to prevent the light from diffusing to the adjacent pixel portions 108. For example, the anti-reflective coating layer 132 may be formed from silicon oxide.

The reflective structures 106 are disposed on the anti-reflective coating layer 132 and fill the trenches 138 respectively. The reflective structures 106 may be formed from metal or dielectric material. In some exemplary examples, the reflective structures 106 are formed from the dielectric material, and each of the reflective structures 106 is a deep trench isolation (DTI) structure. For example, each of the reflective structures 106 may have a height ranging from about 0.1 micrometer to about 2.5 micrometer. The trenches 138 are formed in the border areas 112, such that the reflective structures 106 filling in the trenches 138 are located in the border areas 112.

In some examples, as shown in FIG. 1E, the CMOS image sensor structure 120 may optionally include a buffer layer 140. The buffer layer 140 is disposed on the anti-reflective coating layer 132 and the reflective structures 106, and is located between the anti-reflective coating layer 132 and the metal grid structure 102 and between the anti-reflective coating layer 132 and the passivation layer 134. The buffer layer 140 is suitable for use in increasing the adhesion between the metal grid structure 102 and the anti-reflective coating layer 132. For example, the buffer layer 140 may be formed from a dielectric layer, such as silicon dioxide.

The metal grid structure 102 is disposed on the buffer layer 140, and overlies the anti-reflective coating layer 132. The metal blocking structures 116 of the metal grid structure 102 are disposed in the intersection areas 110 respectively. In the embodiment, as shown in FIG. 1E, the metal blocking structures 116 are disposed in the intersection areas 110 while the reflective structures 106 are disposed in the border areas 112, such that the metal blocking structures 116 and the reflective structures 106 are staggered and arranged in a complementary manner in each of the pixel portions 108. In some examples, the metal blocking structures 116 are formed from metal or a metal alloy, such as tungsten or an aluminum-copper alloy. The metal blocking structures 116 and the reflective structures 106 may be formed from the same material, or may be formed from different materials.

Referring to FIG. 1E again, the passivation layer 134 conformally covers the metal blocking structures 116 and the buffer layer 140 which overlies the anti-reflective coating layer 132 and the reflective structures 106. The passivation layer 134 is suitable for use in protecting the metal blocking structures 116 from being corroded by the color filters 136. In some examples, the passivation layer 134 is formed from silicon oxide, silicon nitride or silicon oxynitride.

As shown in FIG. 1C, FIG. 1D and FIG. 1E, the color filter 136 is disposed on the passivation layer 134 in the intersection areas 110, the border areas 112 and the central area 114. In some exemplary examples, the color filter 136 is a red color filter, a blue color filter or a green color filter. In some examples, a top surface 142 of the color filter 136 is higher than a top 144 of the passivation layer 134. In some examples, each of the pixel portions 108 may optionally include a micro lens 146. The micro lens 146 covers the top surface 142 of the color filter 136.

In each of the pixel portions 108, the layout 100 of the metal grid structure 102 and the layout 104 of the reflective structures 106 are complementary, such that a light guide mechanism of the metal grid structure and the reflective structures is kept for crosstalk improvement while the metal grid structure 102 and the reflective structures 106 can release some areas for optical performance improvement. Furthermore, an occupied area of the metal grid structure 102 is decreased, such that quantum efficiency of the CMOS image sensor structure 120 is increased. Moreover, an occupied area of the reflective structures 106 is decreased, such that damage of the device layer 130 and the substrate 128 caused during the dry etching process of the trenches 138 is reduced, thereby enhancing an imaging performance of the CMOS image sensor 120 and enlarging a process window.

Figure 2A:
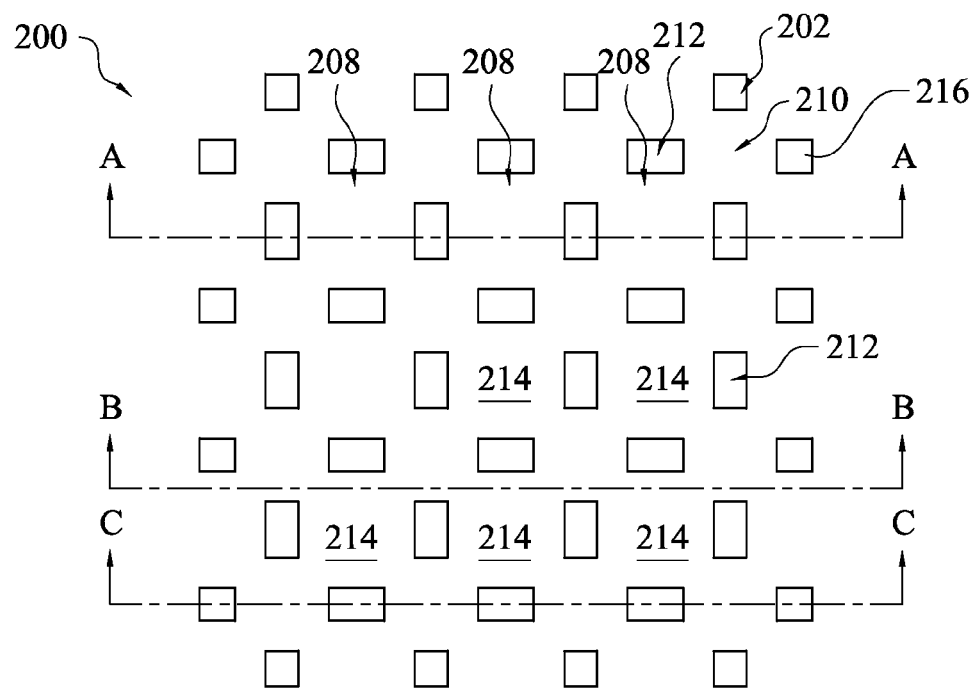
FIG. 2A is a schematic view of a layout of a metal grid structure of a CMOS image sensor structure in accordance with various embodiments.
Figure 2B:
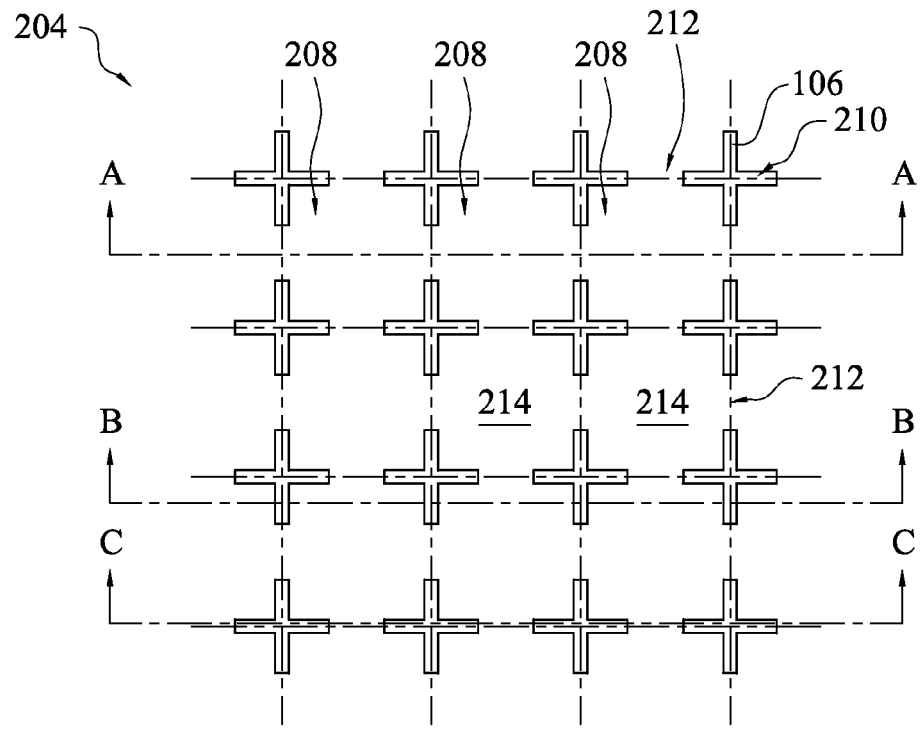
FIG. 2B is a schematic view of a layout of reflective structures of a CMOS image sensor structure in accordance with various embodiments.

Referring to FIG. 2A and FIG. 2B, FIG. 2A is a schematic view of a layout of a metal grid structure of a CMOS image sensor structure in accordance with various embodiments, and FIG. 2B is a schematic view of a layout of reflective structures of a CMOS image sensor structure in accordance with various embodiments. A layout 200 of a metal grid structure 202 and a layout 204 of reflective structures 206 in a CMOS image sensor structure 220 (referring to FIG. 2C) are mesh-like layouts, in which each of the layouts 200 and 204 is modified by removing some portions from a mesh layout. The metal grid structure 202 includes various metal blocking structures 216. As shown in FIG. 2A and FIG. 2B, the metal grid structure 202 and the reflective structures 206 collectively define various pixel portions 208. The pixel portions 208 are arranged in an array, and are adjacent to each other. The metal grid structure 202 and the reflective structures 206 are configured to prevent the light from diffusing to the adjacent pixel portions 208.

In some examples, each of the pixel portions 208 includes various intersection areas 210, various border areas 212 and a central area 214. As shown in FIG. 2A and FIG. 2B, the intersection areas 210 are respectively located at corners of the pixel portion 208. The border areas 212 are respectively located at borders of the pixel portion 208, and each of the border areas 212 is located between any two adjacent ones of the intersection areas 210. The central area 214 is located at a center of the pixel portion 208 and is surrounded by the intersection areas 210 and the border areas 212. The metal blocking structures 216 of the metal grid structure 202 and the reflective structures 206 are arranged in a complementary manner. In the embodiment, the metal blocking structures 216 are respectively disposed in the border areas 212, and the reflective structures 206 are respectively disposed in the intersection areas 210. In some examples, adjacent ones of the reflective structures 206 in the intersection areas 210 which are adjacent to each other are combined to form a shape of a crisscross.

Figure 2C:
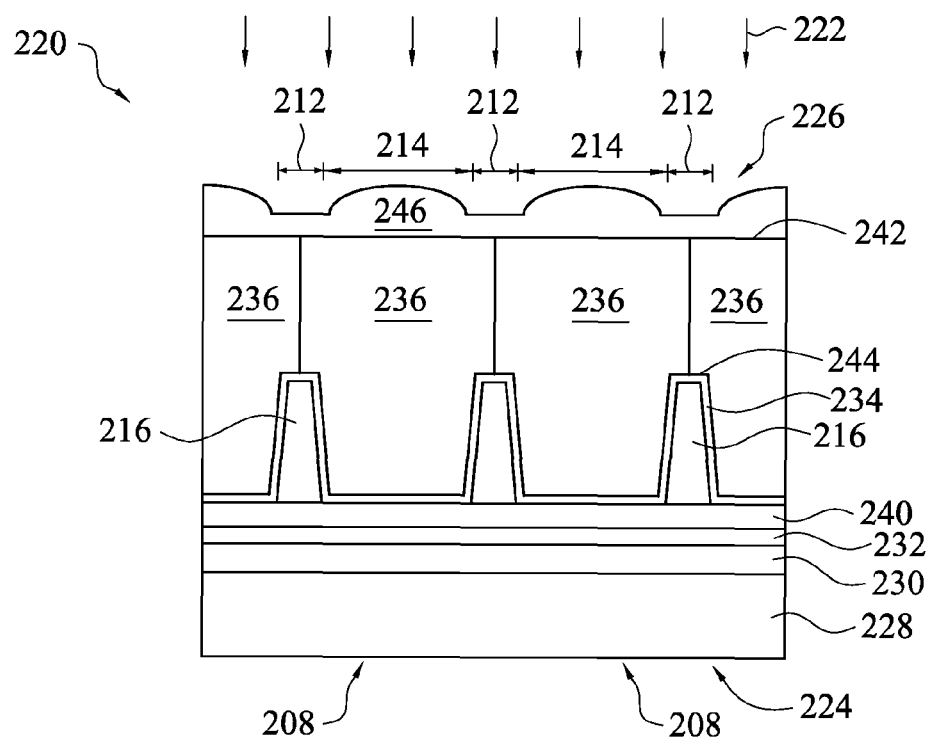
FIG. 2C is schematic cross-sectional view of the CMOS image sensor structure taken along line A-A of FIG. 2A and FIG. 2B.
Figure 2D:
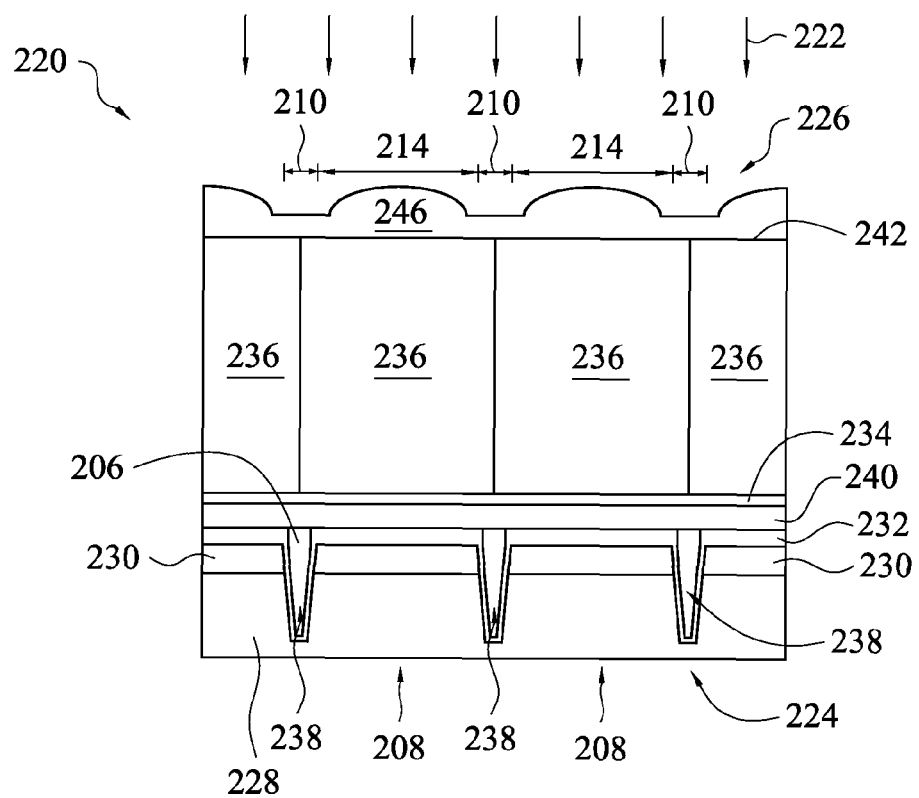
FIG. 2D is schematic cross-sectional view of the CMOS image sensor structure taken along line B-B of FIG. 2A and FIG. 2B.
Figure 2E:
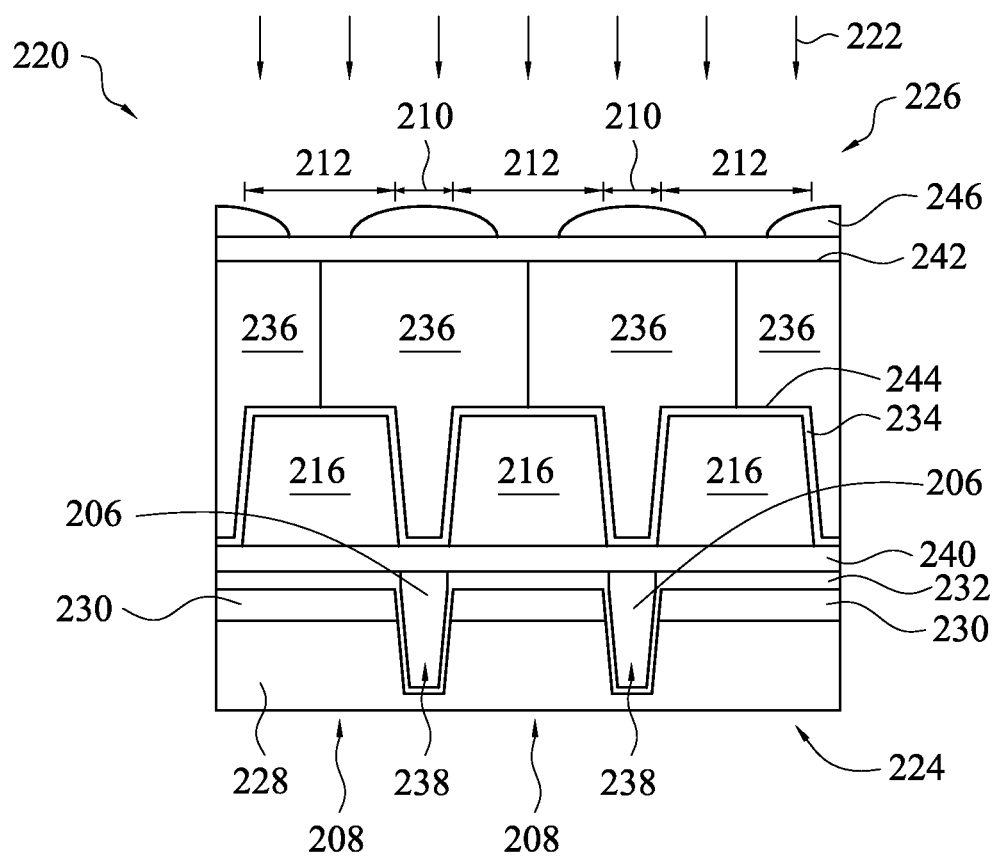
FIG. 2E is schematic cross-sectional view of the CMOS image sensor structure taken along line C-C of FIG. 2A and FIG. 2B.

Referring to FIG. 2C, FIG. 2D and FIG. 2E, FIG. 2C is schematic cross-sectional view of the CMOS image sensor structure taken along line A-A of FIG. 2A and FIG. 2B, FIG. 2D is schematic cross-sectional view of the CMOS image sensor structure taken along line B-B of FIG. 2A and FIG. 2B, and FIG. 2E is schematic cross-sectional view of the CMOS image sensor structure taken along line C-C of FIG. 2A and FIG. 2B. The CMOS image sensor structure 220 may be operated for sensing incident light 222. The CMOS image sensor structure 220 has a front side 224 and a back side 226. In some examples, the CMOS image sensor structure 220 is a BSI CMOS image sensor device, which is operated to sense the incident light 222 projected from its back side 226.

As shown in FIG. 2C, FIG. 2D and FIG. 2E, the CMOS image sensor structure 220 includes a substrate 228 and the pixel portions 208. The substrate 228 is a semiconductor substrate, and may be composed of a single-crystalline semiconductor material or a compound semiconductor material. For example, silicon, germanium or glass may be used as a material of the substrate 228.

The pixel portions 208 are arranged on the substrate 228 in an array and are adjacent to each other. In some examples, as shown in FIG. 2C, FIG. 2D and FIG. 2E, each of the pixel portions 208 includes a device layer 230, an anti-reflective coating layer 232, various discrete reflective structures 206, various discrete metal blocking structures 216, a passivation layer 234 and a color filter 236.

In each of the pixel portions 208, the device layer 230 is disposed in the intersection areas 210, the border areas 212 and the central area 214 on the substrate 228. In some examples, a material of the device layer 230 includes silicon. For example, the material of the device layer 230 may include epitaxial silicon. Referring to FIG. 2C and FIG. 2D again, various trenches 238 are formed in the device layer 230 and the substrate 228 corresponding to the intersection areas 210 respectively. Each of the trenches 238 extends from a top of the device layer 230 to the substrate 228. In some examples, each of the trenches 238 is a deep trench.

As shown in FIG. 2C, FIG. 2D and FIG. 2E, the anti-reflective coating layer 232 conformally covers the device layer 230, the substrate 228 and the trenches 238. The anti-reflective coating layer 232 is configured to prevent the light from diffusing to the adjacent pixel portions 208. For example, the anti-reflective coating layer 232 may be formed from silicon oxide.

The reflective structures 206 are disposed on the anti-reflective coating layer 232 and fill the trenches 238 respectively. The reflective structures 206 may be formed from metal or dielectric material. In some exemplary examples, the reflective structures 206 are formed from the dielectric material, and each of the reflective structures 206 is a deep trench isolation structure. For example, each of the reflective structures 206 may have a height ranging from about 0.1 micrometer to about 2.5 micrometer. The trenches 238 are formed in the intersection areas 210, such that the reflective structures 206 filling in the trenches 238 are located in the intersection areas 210.

In some examples, as shown in FIG. 2E, the CMOS image sensor structure 220 may optionally include a buffer layer 240. The buffer layer 240 is disposed on the anti-reflective coating layer 232 and the reflective structures 206, and is located between the anti-reflective coating layer 232 and the metal grid structure 202 and between the anti-reflective coating layer 232 and the passivation layer 234. The buffer layer 240 is suitable for use in increasing the adhesion between the metal grid structure 202 and the anti-reflective coating layer 232. For example, the buffer layer 240 may be formed from a dielectric layer, such as silicon dioxide.

The metal grid structure 202 is disposed on the buffer layer 240, and overlies the anti-reflective coating layer 232. The metal blocking structures 216 of the metal grid structure 202 are disposed in the border areas 212 respectively. In the embodiment, as shown in FIG. 2E, the metal blocking structures 216 are disposed in the border areas 212 while the reflective structures 206 are disposed in the border areas 210, such that the metal blocking structures 216 and the reflective structures 206 are staggered and arranged in a complementary manner in each of the pixel portions 208. In some examples, the metal blocking structures 216 are formed from metal or a metal alloy, such as tungsten or an aluminum-copper alloy. The metal blocking structures 216 and the reflective structures 206 may be formed from the same material, or may be formed from different materials.

Referring to FIG. 2E again, the passivation layer 234 conformally covers the metal blocking structures 216 and the buffer layer 240 which overlies the anti-reflective coating layer 232 and the reflective structures 206. The passivation layer 234 is suitable for use in protecting the metal blocking structures 216 from being corroded by the color filters 236. In some examples, the passivation layer 234 is formed from silicon oxide, silicon nitride or silicon oxynitride.

As shown in FIG. 2C, FIG. 2D and FIG. 2E, the color filter 236 is disposed on the passivation layer 234 in the intersection areas 210, the border areas 212 and the central area 214. In some exemplary examples, the color filter 236 is a red color filter, a blue color filter or a green color filter. In some examples, a top surface 242 of the color filter 236 is higher than a top 244 of the passivation layer 234. In some examples, each of the pixel portions 208 may optionally include a micro lens 246. The micro lens 246 covers the top surface 242 of the color filter 236.

In each of the pixel portions 208, the layout 200 of the metal grid structure 202 and the layout 204 of the reflective structures 206 are complementary, such that a light guide mechanism of the metal grid structure and the reflective structures is kept for crosstalk improvement while the metal grid structure 202 and the reflective structures 206 can release some areas for optical performance improvement. Furthermore, an occupied area of the metal grid structure 202 is decreased, such that quantum efficiency of the CMOS image sensor structure 220 is increased. Moreover, an occupied area of the reflective structures 206 is decreased, such that damage of the device layer 230 and the substrate 228 caused during the dry etching process of the trenches 238 is reduced, thereby enhancing an imaging performance of the CMOS image sensor 220 and enlarging a process window.

Figure 3A:
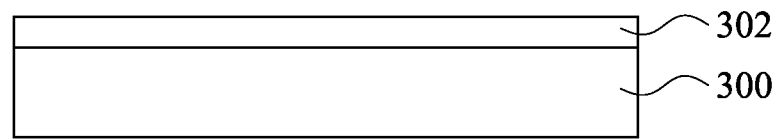
FIG. 3A through FIG. 3I are schematic cross-sectional views of intermediate stages showing a method for manufacturing a CMOS image sensor structure in accordance with various embodiments.

FIG. 3A through FIG. 3I are schematic cross-sectional views of intermediate stages showing a method for manufacturing a CMOS image sensor structure in accordance with various embodiments. As shown in FIG. 3A, a substrate 300 is provided. The substrate 300 is a semiconductor substrate, and may be composed of a single-crystalline semiconductor material or a compound semiconductor material. For example, silicon, germanium or glass may be used as a material of the substrate 300.

Referring to FIG. 3A again, a device layer 302 is formed on the substrate 300 by using, for example, a deposition technique, an epitaxial technique or a bonding technique. In some examples, the operation of forming the device layer 302 includes forming the device layer 302 from silicon. For example, the device layer 302 may be formed from epitaxial silicon.

Figure 3B:
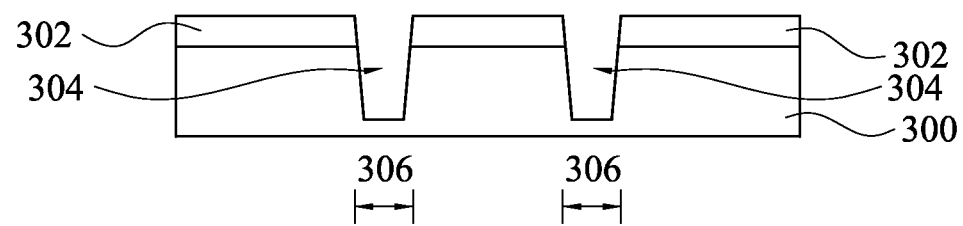

As shown in FIG. 3B, various trenches 304 are formed in the device layer 302 and the substrate 300. In the embodiment, the trenches 304 are only formed in border areas 306. In some examples, the operation of forming the trenches 304 is performed to form various deep trenches. The operation of forming the trenches 304 includes removing a portion of the device layer 302 and a portion of the substrate 300 which underlies the portion of the device layer 302, such that each of the trenches 304 extends from the device layer 302 to the substrate 300. In some exemplary examples, the operation of forming the trenches 304 is performed by using a photolithograph process and an etching process. For example, the etching process may be a dry etching process or a wet etching process.

Figure 3C:
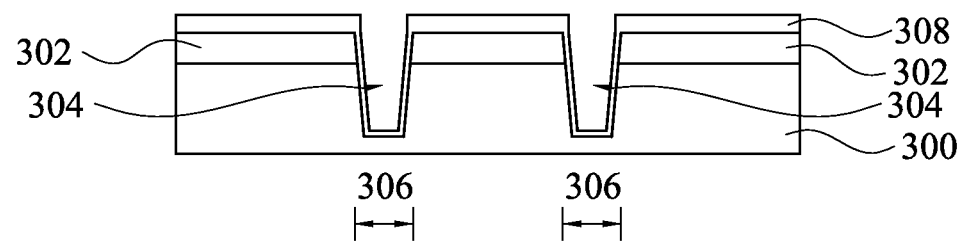

As shown in FIG. 3C, an anti-reflective coating layer 308 is formed to conformally cover the device layer 302, the substrate 300 and the trenches 304. The operation of forming the anti-reflective coating layer 308 may be performed by using a deposition technique, such as a chemical vapor deposition (CVD) technique or a physical vapor deposition (PVD) technique. The anti-reflective coating layer 308 may be formed from silicon oxide.

Figure 3D:
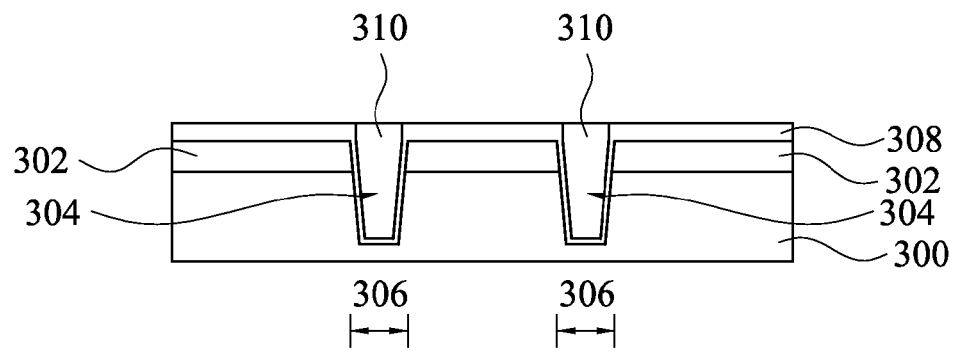

As shown in FIG. 3D, various discrete reflective structures 310 are formed on the anti-reflective coating layer 308 in the trenches 304 respectively by using a deposition technique, such as a chemical vapor deposition technique, a physical vapor deposition technique or a plasma-enhanced chemical vapor deposition (PECVD) technique. The operation of forming the reflective structures 310 includes forming the reflective structures 310 filling the trenches 304 respectively. The reflective structures 310 may be formed from metal or dielectric material. In some exemplary examples, the reflective structures 310 are formed from the dielectric material, and each of the reflective structures 310 is formed to be a deep trench isolation structure. For example, each of the reflective structures 310 may be formed to have a height ranging from about 0.1 micrometer to about 2.5 micrometer. The trenches 304 are only formed in the border areas 306, such that the reflective structures 310 formed in the trenches 304 are located in the border areas 306.

Figure 3E:
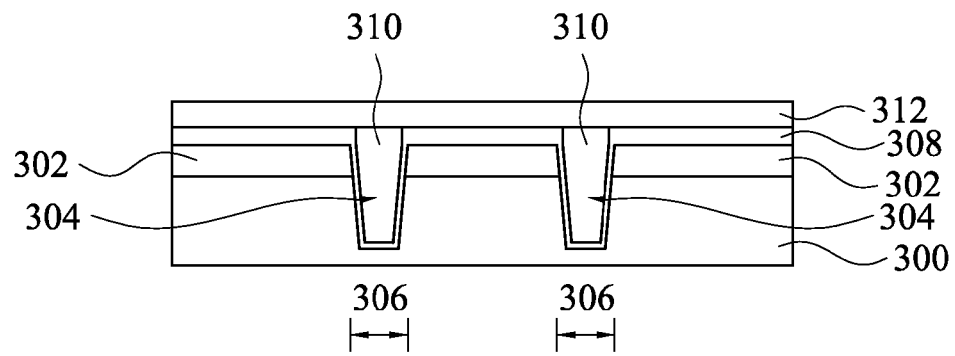

In some examples, as shown in FIG. 3E, a buffer layer 312 may be optionally formed on and covering the anti-reflective coating layer 308 and the reflective structures 310. The operation of forming the buffer layer 312 may be performed by using a deposition technique, such as a chemical vapor deposition technique. For example, the buffer layer 312 may be formed from a dielectric layer, such as silicon dioxide.

Figure 3F:
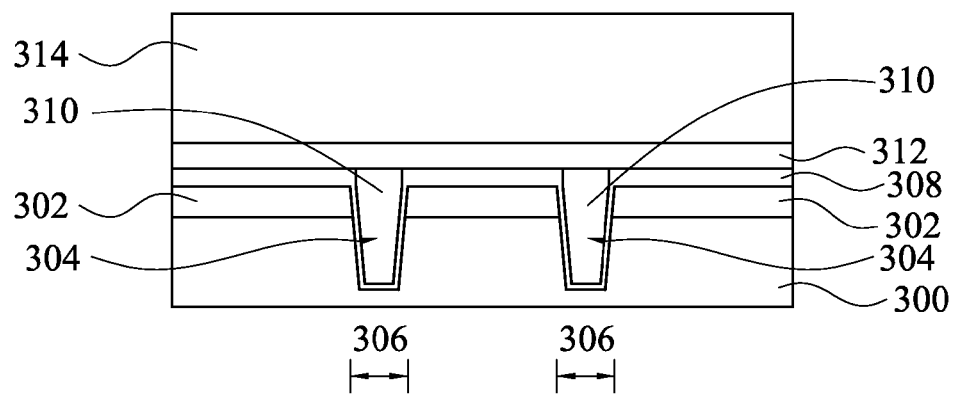
Figure 3G:
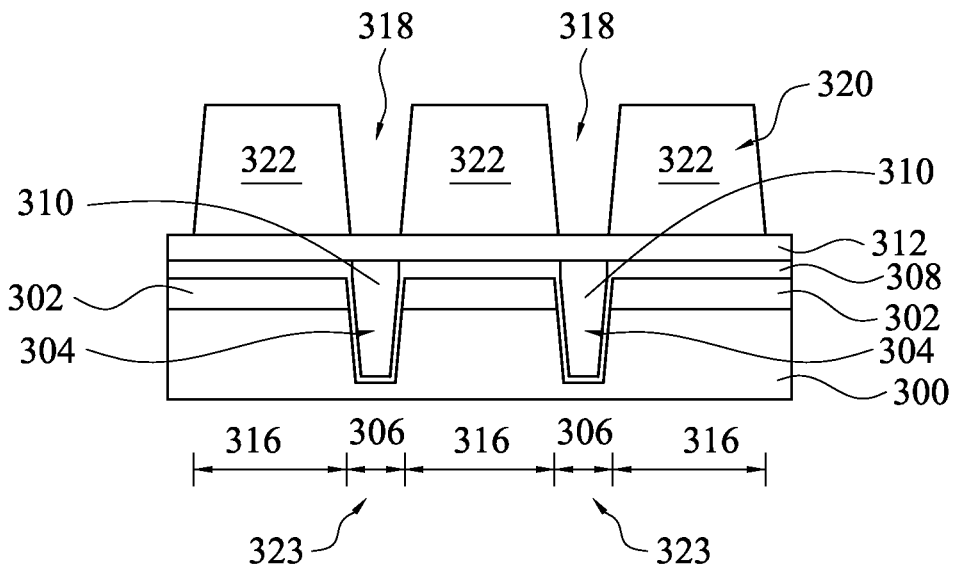

Referring to FIG. 3F and FIG. 3G simultaneously, a metal grid structure 320 is formed on the buffer layer 312 over the anti-reflective coating layer 308. In some examples, the operation of forming the metal grid structure 320 includes forming a metal layer 314 to cover the buffer layer 312 over the anti-reflective coating layer 308 and the reflective structures 310, as shown in FIG. 3F. The metal layer 314 is formed from metal or metal alloy, such as tungsten or aluminum-copper alloy. The metal layer 314 and the reflective structures 310 may be formed from the same material, or may be formed from different materials. The metal layer 314 may be formed by using, for example, a chemical vapor deposition technique or a physical vapor deposition technique.

Referring to FIG. 3F and FIG. 3G again, various cavities 318 are formed in the metal layer 314, so as to complete a metal grid structure 320, which is located on the buffer layer 312 overlying the anti-reflective coating layer 308. For example, the operation of forming the cavities 318 may be performed by using a photolithography process and an etching process. The operation of forming the cavities 318 includes removing a portion of the metal layer 314 to form various discrete metal blocking structures 322. The cavities 318 pass through the metal layer 314 to expose portions of the buffer layer 312. In some examples, as shown in FIG. 3G, each cavity 318 is formed to have a cross section in a shape of trapezoid or rectangle. As shown in FIG. 3G, the metal blocking structures 322 are only formed in intersection areas 316 while the reflective structures 310 are only formed in the border areas 306, such that the metal blocking structures 322 and the reflective structures 310 are staggered and define various pixel portions 323 (such as the pixel portions 108 shown in FIG. 1A and FIG. 1B) over the substrate 300. Each of the pixel portions 323 includes various intersection areas 316, various border areas 306 and a central area (not shown), in which each border area 306 is located between any two adjacent ones of the intersection areas 316, and the central area surrounded by the intersection areas 316 and the border areas 306, such as the pixel portions 108 shown in FIG. 1A and FIG. 1B.

Figure 3H:
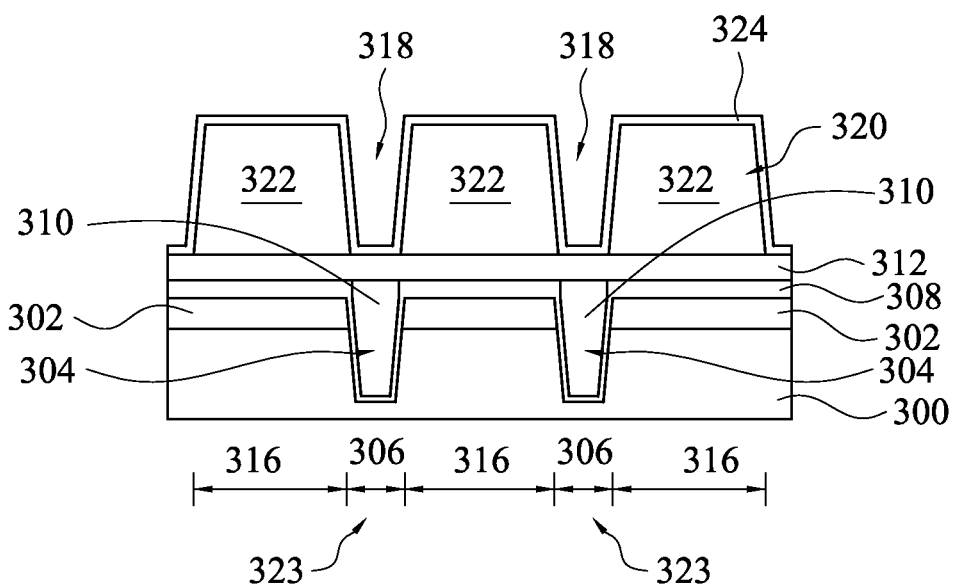

As shown in FIG. 3H, a passivation layer 324 is formed to conformally cover the metal blocking structures 322 of the metal grid structure 320 and the portions of the buffer layer 312 exposed by the cavities 318. The metal blocking structures 322 overly the anti-reflective coating layer 308, and the portions of the buffer layer 312 exposed by the cavities 318 overly the reflective structures 310, such that the passivation layer 324 covers the anti-reflective coating layer 308 and the reflective structures 310. The operation of forming the passivation layer 324 may be performed by using, for example, a chemical vapor deposition technique or a physical vapor deposition technique. In some examples, the passivation layer 324 is formed from silicon oxide, silicon nitride or silicon oxynitride.

Figure 3I:
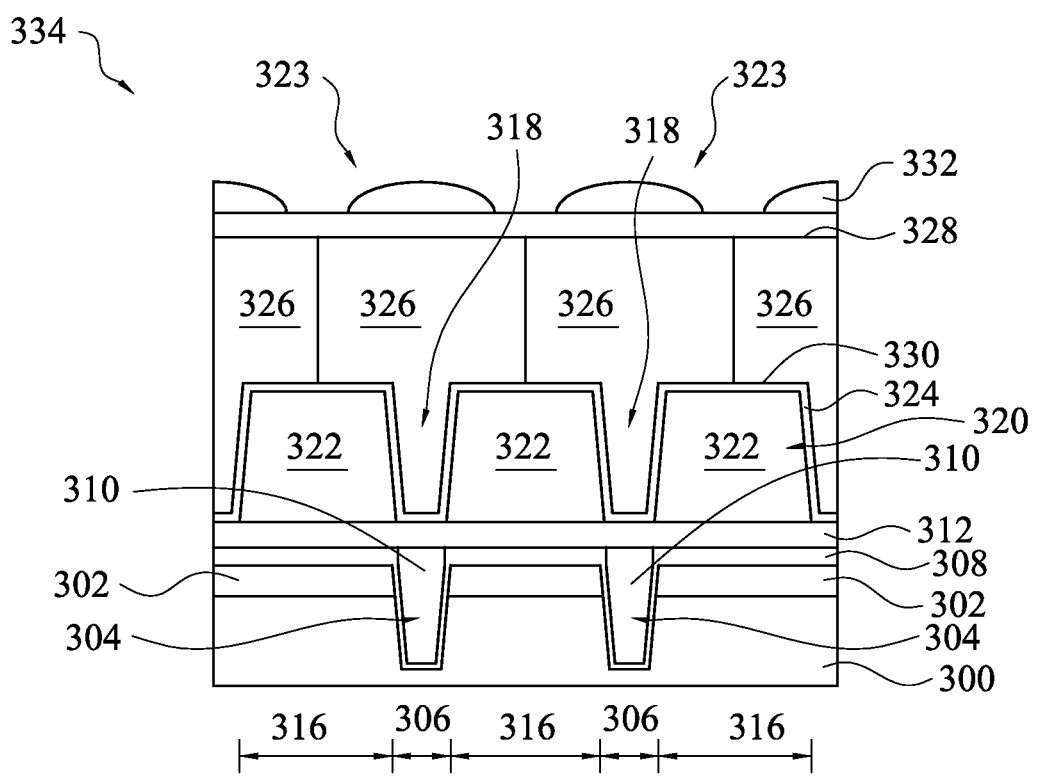

As shown in FIG. 3I, various color filters 326 are formed on the passivation layer 324 and respectively filling the cavities 318. The color filters 326 are respectively formed in the pixel portions 323. The color filters 326 may be arranged sequentially. In some exemplary examples, the color filters 326 are formed to include red color filters, blue color filters and green color filters. In some examples, the operation of forming the color filters 326 is performed to form each of the color filters 326 having a top surface 328, in which the top surfaces 328 are higher than a top 330 of the passivation layer 324. Referring to FIG. 3I again, various micro lenses 332 may be optionally formed to cover the top surfaces 328 of the color filters 326 respectively, so as to complete a CMOS image sensor structure 334.

Figure 4:
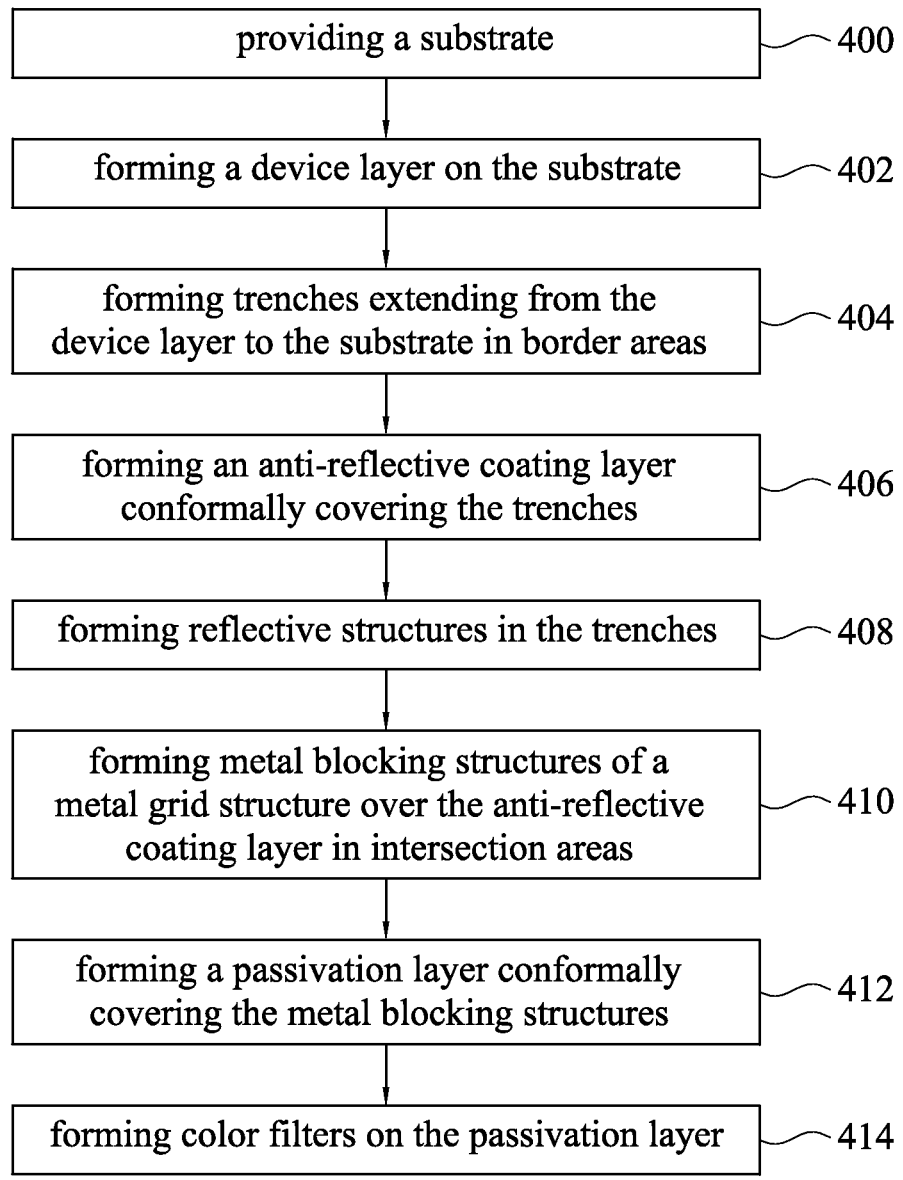
FIG. 4 is a flow chart of a method for manufacturing a CMOS image sensor structure in accordance with various embodiments.

Referring to FIG. 4 with FIG. 3A through FIG. 3I, FIG. 4 is a flow chart of a method for manufacturing a CMOS image sensor structure in accordance with various embodiments. The method begins at operation 400, where a substrate 300 is provided. At operation 402, a device layer 302 is formed on the substrate 300, as shown in FIG. 3A. The operation of forming the device layer 302 may be performed using, for example, a deposition technique, an epitaxial technique or a bonding technique.

At operation 404, as shown in FIG. 3B, various trenches 304 are formed in the device layer 302 and the substrate 300 by using a photolithograph process and an etching process. For example, the etching process may be a dry etching process or a wet etching process. In the embodiment, the trenches 304 are only formed in border areas 306. In some examples, the operation of forming the trenches 304 is performed to form various deep trenches. The operation of forming the trenches 304 includes removing a portion of the device layer 302 and a portion of the substrate 300 which underlies the portion of the device layer 302, such that each of the trenches 304 extends from the device layer 302 to the substrate 300.

At operation 406, as shown in FIG. 3C, an anti-reflective coating layer 308 is formed to conformally cover the device layer 302, the substrate 300 and the trenches 304 by using a deposition technique, such as a chemical vapor deposition technique or a physical vapor deposition technique.

At operation 408, as shown in FIG. 3D, various discrete reflective structures 310 are formed on the anti-reflective coating layer 308 in the trenches 304 respectively by using a deposition technique, such as a chemical vapor deposition technique, a physical vapor deposition technique or a plasma-enhanced chemical vapor deposition technique. The operation of forming the reflective structures 310 includes forming the reflective structures 310 filling the trenches 304 respectively. In some exemplary examples, each of the reflective structures 310 is formed to be a deep trench isolation structure. For example, each of the reflective structures 510 may be formed to have a height ranging from about 0.1 micrometer to about 2.5 micrometer. The trenches 304 are only formed in the border areas 306, such that the reflective structures 310 formed in the trenches 304 are located in the border areas 306. As shown in FIG. 3E, a buffer layer 312 may be optionally formed on and covering the anti-reflective coating layer 308 and the reflective structures 310 by using a deposition technique, such as a chemical vapor deposition technique.

At operation 410, referring to FIG. 3F and FIG. 3G simultaneously, a metal grid structure 320 is formed on the buffer layer 312 over the anti-reflective coating layer 308. In some examples, the operation of forming the metal grid structure 320 includes forming a metal layer 314 to cover the buffer layer 312 over the anti-reflective coating layer 308 and the reflective structures 310, as shown in FIG. 3F. The metal layer 314 may be formed by using, for example, a chemical vapor deposition technique or a physical vapor deposition technique.

Referring to FIG. 3F and FIG. 3G again, various cavities 318 are formed in the metal layer 314 by using a photolithography process and an etching process, so as to complete a metal grid structure 320 on the buffer layer 312. The operation of forming the cavities 318 includes removing a portion of the metal layer 314 to form various discrete metal blocking structures 322. The cavities 318 pass through the metal layer 314 to expose portions of the buffer layer 312. As shown in FIG. 3G, the metal blocking structures 322 are only formed in intersection areas 316 while the reflective structures 310 are only formed in the border areas 306, such that the metal blocking structures 322 and the reflective structures 310 are staggered and define various pixel portions 323 (such as the pixel portions 108 shown in FIG. 1A and FIG. 1B) over the substrate 300. Each of the pixel portions 323 includes various intersection areas 316, various border areas 306 and a central area (not shown), in which each border area 306 is located between any two adjacent ones of the intersection areas 316, and the central area surrounded by the intersection areas 316 and the border areas 306, such as the pixel portions 108 shown in FIG. 1A and FIG. 1B.

At operation 412, as shown in FIG. 3H, a passivation layer 324 is formed to conformally cover the metal blocking structures 322 and the portions of the buffer layer 312 exposed by the cavities 318. The operation of forming the passivation layer 324 may be performed by using, for example, a chemical vapor deposition technique or a physical vapor deposition technique.

At operation 414, as shown in FIG. 3I, various color filters 326 are formed on the passivation layer 324 and respectively filling the cavities 318. The color filters 326 are respectively formed in the pixel portions 323. In some exemplary examples, the color filters 326 are formed to include red color filters, blue color filters and green color filters. In some examples, the operation of forming the color filters 326 is performed to form each of the color filters 326 having a top surface 328, in which the top surfaces 328 are higher than a top 330 of the passivation layer 324. Referring to FIG. 3I again, various micro lenses 332 may be optionally formed to cover the top surfaces 328 of the color filters 326 respectively, so as to complete a CMOS image sensor structure 334.

Figure 5A:
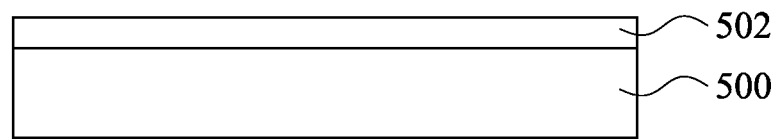
FIG. 5A through FIG. 5I are schematic cross-sectional views of intermediate stages showing a method for manufacturing a CMOS image sensor structure in accordance with various embodiments.

FIG. 5A through FIG. 5I are schematic cross-sectional views of intermediate stages showing a method for manufacturing a CMOS image sensor structure in accordance with various embodiments. As shown in FIG. 5A, a substrate 500 is provided. The substrate 500 is a semiconductor substrate, and may be composed of a single-crystalline semiconductor material or a compound semiconductor material. For example, silicon, germanium or glass may be used as a material of the substrate 500.

Referring to FIG. 5A again, a device layer 502 is formed on the substrate 500 by using, for example, a deposition technique, an epitaxial technique or a bonding technique. In some examples, the operation of forming the device layer 502 includes forming the device layer 502 from silicon. For example, the device layer 502 may be formed from epitaxial silicon.

Figure 5B:
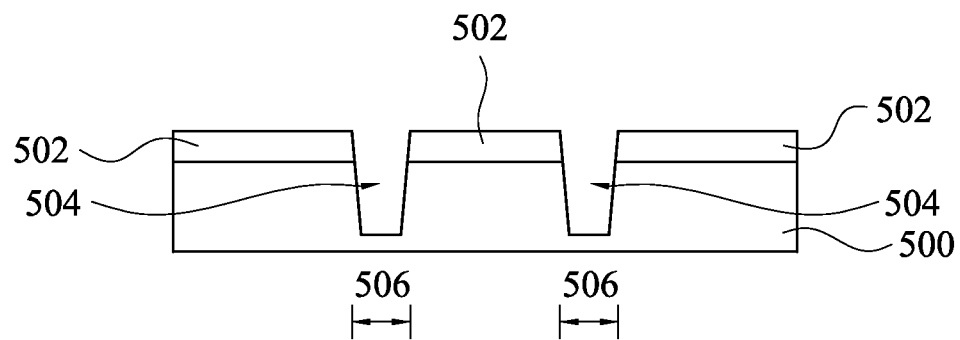

As shown in FIG. 5B, various trenches 504 are formed in the device layer 502 and the substrate 500. In the embodiment, the trenches 504 are only formed in intersection areas 506. In some examples, the operation of forming the trenches 504 is performed to form various deep trenches. The operation of forming the trenches 504 includes removing a portion of the device layer 502 and a portion of the substrate 500 which underlies the portion of the device layer 502, such that each of the trenches 504 extends from the device layer 502 to the substrate 500. In some exemplary examples, the operation of forming the trenches 504 is performed by using a photolithograph process and an etching process. For example, the etching process may be a dry etching process or a wet etching process.

Figure 5C:
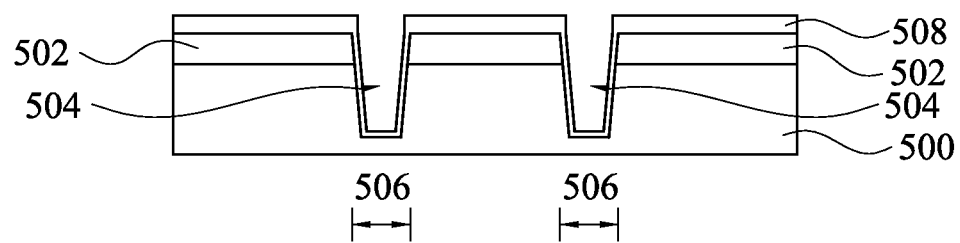

As shown in FIG. 5C, an anti-reflective coating layer 508 is formed to conformally cover the device layer 502, the substrate 500 and the trenches 504. The operation of forming the anti-reflective coating layer 508 may be performed by using a deposition technique, such as a chemical vapor deposition technique or a physical vapor deposition technique. The anti-reflective coating layer 508 may be formed from silicon oxide.

Figure 5D:
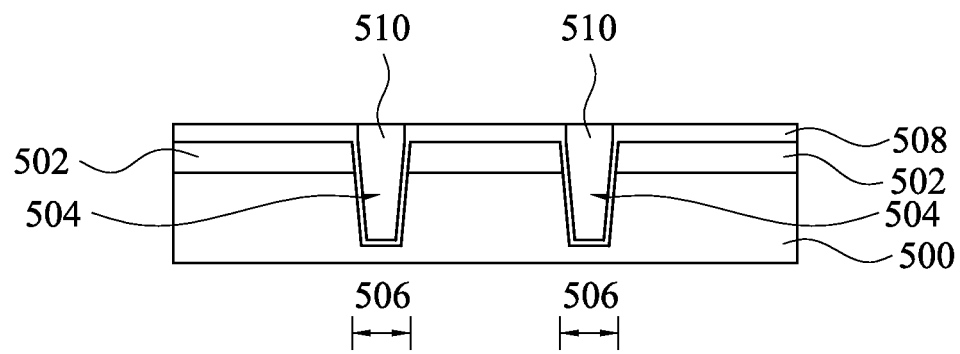

As shown in FIG. 5D, various discrete reflective structures 510 are formed on the anti-reflective coating layer 508 in the trenches 504 respectively by using a deposition technique, such as a chemical vapor deposition technique, a physical vapor deposition technique or a plasma-enhanced chemical vapor deposition technique. The operation of forming the reflective structures 510 includes forming the reflective structures 510 filling the trenches 504 respectively. The reflective structures 510 may be formed from metal or dielectric material. In some exemplary examples, the reflective structures 510 are formed from the dielectric material, and each of the reflective structures 510 is formed to be a deep trench isolation structure. For example, each of the reflective structures 510 may be formed to have a height ranging from about 0.1 micrometer to about 2.5 micrometer. The trenches 504 are only formed in the intersection areas 506, such that the reflective structures 510 formed in the trenches 504 are located in the intersection areas 506.

Figure 5E:
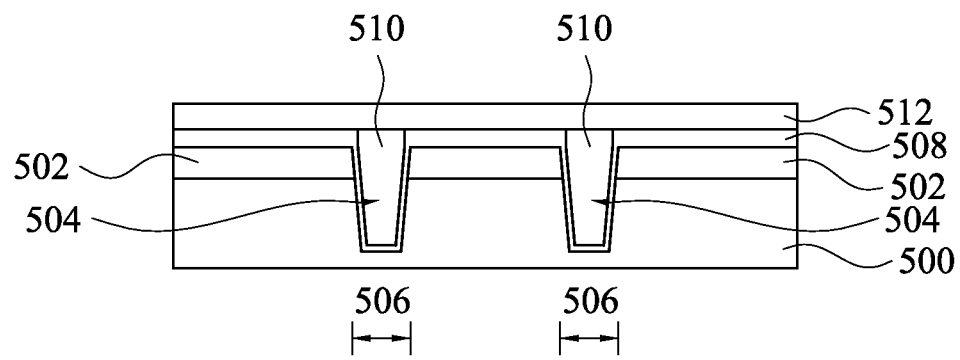

In some examples, as shown in FIG. 5E, a buffer layer 512 may be optionally formed on and covering the anti-reflective coating layer 508 and the reflective structures 510. The operation of forming the buffer layer 512 may be performed by using a deposition technique, such as a chemical vapor deposition technique. For example, the buffer layer 512 may be formed from a dielectric layer, such as silicon dioxide.

Figure 5F:
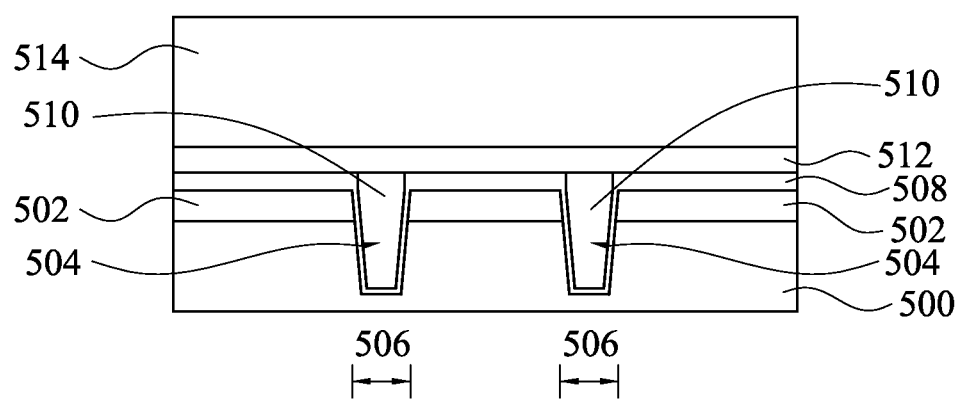
Figure 5G:
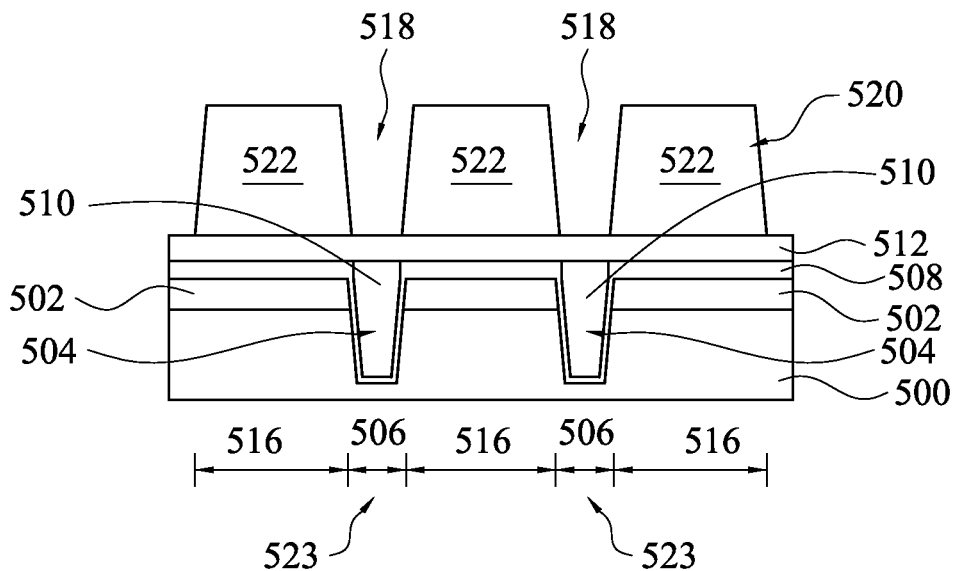

Referring to FIG. 5F and FIG. 5G simultaneously, a metal grid structure 520 is formed on the buffer layer 512 over the anti-reflective coating layer 508. In some examples, the operation of forming the metal grid structure 520 includes forming a metal layer 514 to cover the buffer layer 512 over the anti-reflective coating layer 508 and the reflective structures 510, as shown in FIG. 5F. The metal layer 514 is formed from metal or metal alloy, such as tungsten or aluminum-copper alloy. The metal layer 514 and the reflective structures 510 may be formed from the same material, or may be formed from different materials. The metal layer 514 may be formed by using, for example, a chemical vapor deposition technique or a physical vapor deposition technique.

Referring to FIG. 5F and FIG. 5G again, various cavities 518 are formed in the metal layer 514, so as to complete a metal grid structure 520, which is located on the buffer layer 512 overlying the anti-reflective coating layer 508. For example, the operation of forming the cavities 518 may be performed by using a photolithography process and an etching process. The operation of forming the cavities 518 includes removing a portion of the metal layer 514 to form various discrete metal blocking structures 522. The cavities 518 pass through the metal layer 514 to expose portions of the buffer layer 512. In some examples, as shown in FIG. 5G, each cavity 518 is formed to have a cross section in a shape of trapezoid or rectangle. As shown in FIG. 5G, the metal blocking structures 522 are only formed in border areas 516 while the reflective structures 510 are only formed in the intersection areas 506, such that the metal blocking structures 522 and the reflective structures 510 are staggered and define various pixel portions 523 (such as the pixel portions 208 shown in FIG. 2A and FIG. 2B) over the substrate 500. Each of the pixel portions 523 includes various intersection areas 506, various border areas 516 and a central area (not shown), in which each border area 516 is located between any two adjacent ones of the intersection areas 506, and the central area surrounded by the intersection areas 506 and the border areas 516, such as the pixel portions 208 shown in FIG. 2A and FIG. 2B.

Figure 5H:
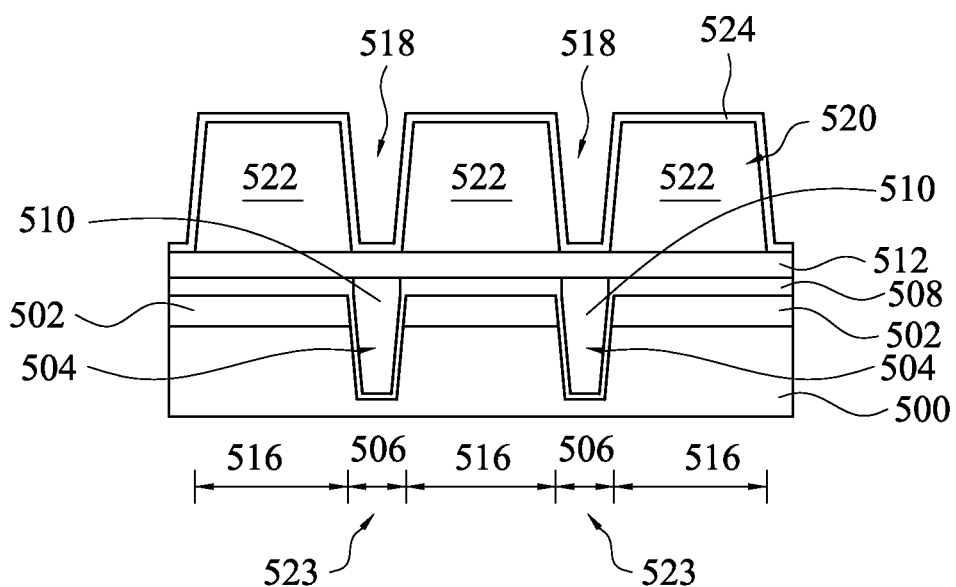

As shown in FIG. 5H, a passivation layer 524 is formed to conformally cover the metal blocking structures 522 of the metal grid structure 520 and the portions of the buffer layer 512 exposed by the cavities 518. The metal blocking structures 522 overly the anti-reflective coating layer 508, and the portions of the buffer layer 512 exposed by the cavities 518 overly the reflective structures 510, such that the passivation layer 524 covers the anti-reflective coating layer 508 and the reflective structures 510. The operation of forming the passivation layer 524 may be performed by using, for example, a chemical vapor deposition technique or a physical vapor deposition technique. In some examples, the passivation layer 524 is formed from silicon oxide, silicon nitride or silicon oxynitride.

Figure 5I:
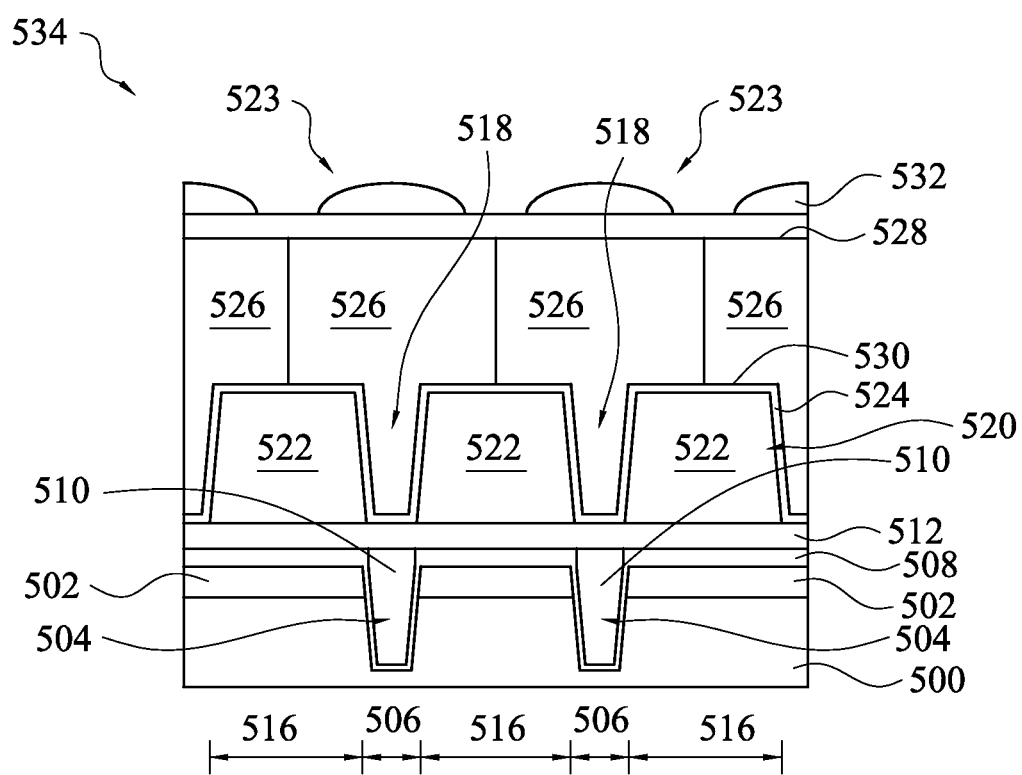

As shown in FIG. 5I, various color filters 526 are formed on the passivation layer 524 and respectively filling the cavities 518. The color filters 526 are respectively formed in the pixel portions 523. The color filters 526 may be arranged sequentially. In some exemplary examples, the color filters 526 are formed to include red color filters, blue color filters and green color filters. In some examples, the operation of forming the color filters 526 is performed to form each of the color filters 526 having a top surface 528, in which the top surfaces 528 are higher than a top 530 of the passivation layer 524. Referring to FIG. 5I again, various micro lenses 532 may be optionally formed to cover the top surfaces 528 of the color filters 526 respectively, so as to complete a CMOS image sensor structure 534.

Figure 6:
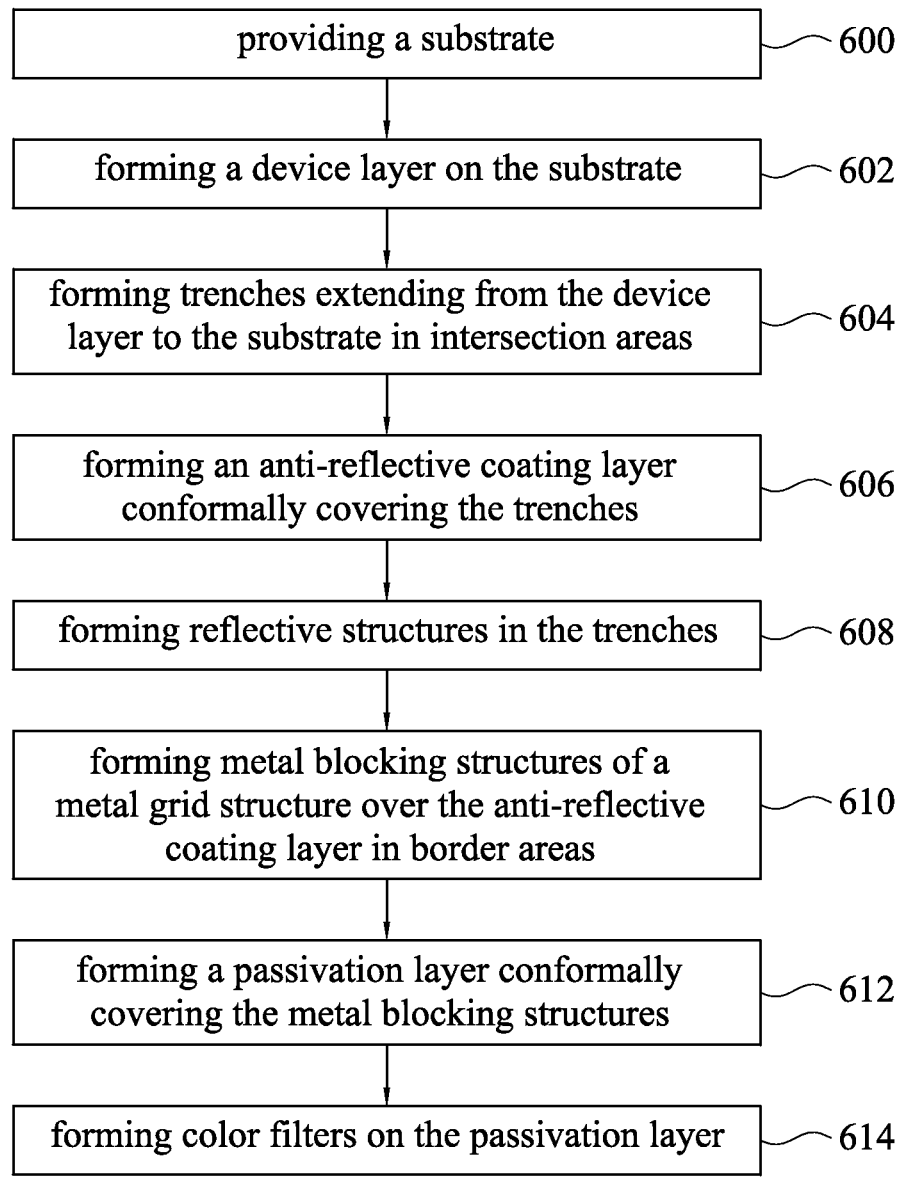
FIG. 6 is a flow chart of a method for manufacturing a CMOS image sensor structure in accordance with various embodiments.

Referring to FIG. 6 with FIG. 5A through FIG. 5I, FIG. 6 is a flow chart of a method for manufacturing a CMOS image sensor structure in accordance with various embodiments. The method begins at operation 600, where a substrate 500 is provided. At operation 502, a device layer 502 is formed on the substrate 500, as shown in FIG. 5A. The operation of forming the device layer 502 may be performed using, for example, a deposition technique, an epitaxial technique or a bonding technique.

At operation 604, as shown in FIG. 5B, various trenches 504 are formed in the device layer 502 and the substrate 500 by using a photolithograph process and an etching process. For example, the etching process may be a dry etching process or a wet etching process. In the embodiment, the trenches 504 are only formed in intersection areas 506. In some examples, the operation of forming the trenches 504 is performed to form various deep trenches. The operation of forming the trenches 504 includes removing a portion of the device layer 502 and a portion of the substrate 500 which underlies the portion of the device layer 502, such that each of the trenches 504 extends from the device layer 502 to the substrate 500.

At operation 606, as shown in FIG. 5C, an anti-reflective coating layer 508 is formed to conformally cover the device layer 502, the substrate 500 and the trenches 504 by using a deposition technique, such as a chemical vapor deposition technique or a physical vapor deposition technique.

At operation 608, as shown in FIG. 5D, various discrete reflective structures 510 are formed on the anti-reflective coating layer 508 in the trenches 504 respectively by using a deposition technique, such as a chemical vapor deposition technique, a physical vapor deposition technique or a plasma-enhanced chemical vapor deposition technique. The operation of forming the reflective structures 510 includes forming the reflective structures 510 filling the trenches 504 respectively. In some exemplary examples, each of the reflective structures 510 is formed to be a deep trench isolation structure. For example, each of the reflective structures 510 may be formed to have a height ranging from about 0.1 micrometer to about 2.5 micrometer. The trenches 504 are only formed in the intersection areas 506, such that the reflective structures 510 formed in the trenches 504 are located in the intersection areas 506. As shown in FIG. 5E, a buffer layer 512 may be optionally formed on and covering the anti-reflective coating layer 508 and the reflective structures 510 by using a deposition technique, such as a chemical vapor deposition technique.

At operation 610, referring to FIG. 5F and FIG. 5G simultaneously, a metal grid structure 520 is formed on the buffer layer 512 over the anti-reflective coating layer 508. In some examples, the operation of forming the metal grid structure 520 includes forming a metal layer 514 to cover the buffer layer 512 over the anti-reflective coating layer 508 and the reflective structures 510, as shown in FIG. 5F. The metal layer 514 may be formed by using, for example, a chemical vapor deposition technique or a physical vapor deposition technique.

Referring to FIG. 5F and FIG. 5G again, various cavities 518 are formed in the metal layer 514 by using a photolithography process and an etching process, so as to complete a metal grid structure 520 on the buffer layer 512. The operation of forming the cavities 518 includes removing a portion of the metal layer 514 to form various discrete metal blocking structures 522. The cavities 518 pass through the metal layer 514 to expose portions of the buffer layer 512. As shown in FIG. 5G, the metal blocking structures 522 are only formed in border areas 516 while the reflective structures 510 are only formed in the intersection areas 506, such that the metal blocking structures 522 and the reflective structures 510 are staggered and define various pixel portions 523 (such as the pixel portions 208 shown in FIG. 2A and FIG. 2B) over the substrate 500. Each of the pixel portions 523 includes various intersection areas 506, various border areas 516 and a central area (not shown), in which each border area 516 is located between any two adjacent ones of the intersection areas 506, and the central area surrounded by the intersection areas 506 and the border areas 516, such as the pixel portions 208 shown in FIG. 2A and FIG. 2B.

At operation 612, as shown in FIG. 5H, a passivation layer 524 is formed to conformally cover the metal blocking structures 522 and the portions of the buffer layer 512 exposed by the cavities 518. The operation of forming the passivation layer 524 may be performed by using, for example, a chemical vapor deposition technique or a physical vapor deposition technique.

At operation 614, as shown in FIG. 5I, various color filters 526 are formed on the passivation layer 524 and respectively filling the cavities 518. The color filters 526 are respectively formed in the pixel portions 523. In some exemplary examples, the color filters 526 are formed to include red color filters, blue color filters and green color filters. In some examples, the operation of forming the color filters 526 is performed to form each of the color filters 526 having a top surface 528, in which the top surfaces 528 are higher than a top 530 of the passivation layer 524. Referring to FIG. 5I again, various micro lenses 532 may be optionally formed to cover the top surfaces 528 of the color filters 526 respectively, so as to complete a CMOS image sensor structure 534.

In accordance with an embodiment, the present disclosure discloses a CMOS image sensor structure. The CMOS image sensor structure includes a substrate and various pixel portions, in which the pixel portions are disposed adjacent to each other on the substrate. Each of the pixel portions includes various intersection areas, various the border areas each of which is located between any two adjacent ones of the intersection areas, and a central area surrounded by the intersection areas and the border areas. Each of the pixel portions includes a device layer, an anti-reflective coating layer, various discrete reflective structures, various discrete metal blocking structures, a passivation layer and a color filter. The device layer is disposed in the intersection areas, the border areas and the central area on the substrate. Various trenches are formed in the device layer and the substrate corresponding to the border areas respectively. The anti-reflective coating layer conformally covers the device layer, the substrate and the trenches. The reflective structures are disposed on the anti-reflective coating layer in the trenches respectively. The metal blocking structures overly the anti-reflective coating layer in the intersection areas respectively. The passivation layer conformally covers the metal blocking structures, the anti-reflective coating layer and the reflective structures. The color filter is disposed on the passivation layer in the intersection areas, the border areas and the central area.

In accordance with another embodiment, the present disclosure discloses a CMOS image sensor structure. The CMOS image sensor structure a substrate and various pixel portions, in which the pixel portions are disposed adjacent to each other on the substrate. Each of the pixel portions includes various intersection areas, various the border areas each of which is located between any two adjacent ones of the intersection areas, and a central area surrounded by the intersection areas and the border areas. Each of the pixel portions includes a device layer, an anti-reflective coating layer, various discrete reflective structures, various discrete metal blocking structures, a passivation layer and a color filter. The device layer is disposed in the intersection areas, the border areas and the central area on the substrate. Various trenches are formed in the device layer and the substrate corresponding to the intersection areas respectively. The anti-reflective coating layer conformally covers the device layer, the substrate and the trenches. The reflective structures are disposed on the anti-reflective coating layer in the trenches respectively. The metal blocking structures overly the anti-reflective coating layer in the border areas respectively. The passivation layer conformally covers the metal blocking structures, the anti-reflective coating layer and the reflective structures. The color filter is disposed on the passivation layer in the intersection areas, the border areas and the central area.

In accordance with yet another embodiment, the present disclosure discloses a method for manufacturing a CMOS image sensor structure. In this method, a substrate is provided. A device layer is formed on the substrate. Various trenches are formed to extend from the device layer to the substrate. An anti-reflective coating layer is formed to conformally cover the device layer, the substrate and the trenches. Various discrete reflective structures are formed on the anti-reflective coating layer in the trenches respectively. A metal grid structure is formed over the anti-reflective coating layer. The metal grid structure is formed to include various discrete metal blocking structures, and the metal blocking structures and the reflective structures are staggered and define various pixel portions over the substrate. A passivation layer is formed to conformally cover the metal blocking structures, the anti-reflective coating layer and the reflective structures. Various color filters are formed on the passivation layer in the pixel portions respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A CMOS image sensor structure, comprising:
    a substrate; and
    a plurality of pixel portions disposed adjacent to each other on the substrate, wherein each of the pixel portions comprises a plurality of intersection areas, a plurality of border areas each of which is located between any two adjacent ones of the intersection areas, and a central area surrounded by the intersection areas and the border areas, wherein each of the pixel portions comprises:
    a device layer disposed in the intersection areas, the border areas and the central area on the substrate, wherein a plurality of trenches are formed in the device layer and the substrate;
    an anti-reflective coating layer conformally covering the device layer, the substrate, and the trenches;
    a plurality of discrete reflective structures disposed on the anti-reflective coating layer in the trenches respectively;
    a plurality of discrete metal blocking structures overlying the anti-reflective coating layer, wherein the metal blocking structures and the reflective structures are staggered and surround the central area;
    a passivation layer conformally covering the metal blocking structures, the anti-reflective coating layer, and the reflective structures; and
    a color filter disposed on the passivation layer in the intersection areas, the border areas, and the central area.

2. The CMOS image sensor structure of claim 1, wherein each of the reflective structures is a deep trench isolation structure.

3. The CMOS image sensor structure of claim 2, wherein each of the reflective structures has a height ranging substantially from 0.1 micrometer to 2.5 micrometer.

4. The CMOS image sensor structure of claim 1, wherein the reflective structures are formed from metal.

5. The CMOS image sensor structure of claim 1, wherein the metal blocking structures are formed from tungsten or an aluminum-copper alloy.

6. The CMOS image sensor structure of claim 1, further comprising a buffer layer disposed between the anti-reflective coating layer and the passivation layer.

7. The CMOS image sensor structure of claim 1, wherein each of the pixel portions further comprises a micro lens covering a top surface of the color filter.

8. The CMOS image sensor structure of claim 1, wherein
    the trenches correspond to the border areas respectively; and
    the metal blocking structures are disposed in the intersection areas respectively.

9. The CMOS image sensor structure of claim 1, wherein a material of the device layer comprises epitaxial silicon.

10. The CMOS image sensor structure of claim 1, wherein each of the reflective structures has a top surface which is elevated at the same level with a top of the anti-reflective coating layer.

11. The CMOS image sensor structure of claim 1, wherein the metal blocking structures and the reflective structures are formed from a same material.

12. The CMOS image sensor structure of claim 1, wherein the metal blocking structures are separated from the reflective structures.

13. The CMOS image sensor structure of claim 1, wherein the reflective structures fully fill the trenches respectively.

14. A CMOS image sensor structure, comprising:
a substrate; and
a plurality of pixel portions disposed adjacent to each other on the substrate, wherein each of the pixel portions comprises a central area, wherein each of the pixel portions comprises:
  a device layer disposed on the substrate, wherein a plurality of trenches are formed in the device layer and the substrate;
  an anti-reflective coating layer conformally covering the device layer, the substrate, and the trenches;
  a plurality of discrete reflective structures disposed on the anti-reflective coating layer in the trenches respectively;
  a plurality of discrete metal blocking structures overlying the anti-reflective coating layer, wherein each of the reflective structures is located between any two adjacent ones of the metal blocking structures, and the metal blocking structures and the reflective structures are staggered and surround the central area;
  a passivation layer conformally covering the metal blocking structures, the anti-reflective coating layer, and the reflective structures; and
  a color filter disposed on the passivation layer.

15. The CMOS image sensor structure of claim 14, wherein the metal blocking structures and the reflective structures are formed from a same material.

16. The CMOS image sensor structure of claim 14, wherein the metal blocking structures are separated from the reflective structures.

17. The CMOS image sensor structure of claim 14, wherein each of the reflective structures has a top surface which is elevated at the same level with a top of the anti-reflective coating layer.

18. A CMOS image sensor structure, comprising:
a substrate; and
a plurality of pixel portions disposed adjacent to each other on the substrate, wherein each of the pixel portions comprises a plurality of intersection areas, a plurality of border areas each of which is located between any two adjacent ones of the intersection areas, and a central area surrounded by the intersection areas and the border areas, wherein each of the pixel portions comprises:
  a device layer disposed in the intersection areas, the border areas, and the central area on the substrate, wherein a plurality of trenches are formed in the device layer and the substrate corresponding to the border areas respectively;
  an anti-reflective coating layer conformally covering the device layer, the substrate, and the trenches;
  a plurality of discrete reflective structures disposed on the anti-reflective coating layer in the trenches respectively;
  a buffer layer disposed on the anti-reflective coating layer and the reflective structures;
  a plurality of discrete metal blocking structures disposed on the buffer layer and overlying the anti-reflective coating layer in the intersection areas respectively, wherein the metal blocking structures and the reflective structures are staggered and surround the central area;
  a passivation layer conformally covering the metal blocking structures and the buffer layer; and
  a color filter disposed on the passivation layer in the intersection areas, the border areas, and the central area.

19. The CMOS image sensor structure of claim 18, wherein the metal blocking structures and the reflective structures are formed from a same material.

20. The CMOS image sensor structure of claim 18, wherein each of the reflective structures has a top surface which is elevated at the same level with a top of the anti-reflective coating layer.

* * * * *